United States Patent [19]

Moll et al.

[11] Patent Number: 4,649,344
[45] Date of Patent: Mar. 10, 1987

[54] TEST CIRCUIT FOR DETECTOR USED IN WELL BORE

[75] Inventors: Helmut Moll, Irvine; Roger E. Ritchie, Santa Ana, both of Calif.

[73] Assignee: Scientific Drilling International, Houston, Tex.

[21] Appl. No.: 606,210

[22] Filed: May 2, 1984

[51] Int. Cl.⁴ .................... G01R 35/00; G01N 27/72
[52] U.S. Cl. .................................... 324/221; 324/202
[58] Field of Search ............................ 324/219–221, 324/228, 226, 227, 234, 236, 244, 262, 345, 346, 202; 73/1 R, 1 E; 175/45; 166/250, 66, 65 M, 65 R; 340/514, 870.04; 364/422, 560, 571, 579

[56] References Cited
U.S. PATENT DOCUMENTS

| | | | |
|---|---|---|---|
| 2,246,542 | 6/1941 | Smith | 324/221 X |
| 2,250,703 | 7/1941 | Crites et al. | 324/221 X |
| 2,686,039 | 8/1954 | Bender | 324/221 X |
| 2,817,808 | 12/1957 | Gieske | 324/221 |
| 2,906,944 | 9/1959 | Lebourg | 324/220 |
| 3,088,068 | 4/1963 | Hall, Jr. et al. | 324/221 |
| 3,883,797 | 5/1975 | Abrukin | 324/221 X |
| 4,365,197 | 12/1982 | Pyatt et al. | 324/221 |
| 4,393,598 | 7/1983 | Powell et al. | 324/221 X |
| 4,527,122 | 7/1985 | Pyatt et al. | 324/221 X |

FOREIGN PATENT DOCUMENTS 0000855 11/1979 PCT Int'l Appl. ................ 324/221

OTHER PUBLICATIONS

"M.A.C. Monel Sensor ™ Instructions" M.A.C. Instrument, p. 2.

Primary Examiner—Gerard R. Strecker
Assistant Examiner—Warren S. Edmonds
Attorney, Agent, or Firm—William W. Haefliger

[57] ABSTRACT

A device to be lowered into a string of well drilling pipe to the location of a non-magnetic section of the pipe near its lower end, with the device including a compass assembly or other instrument for making a photograph or other record at that location. The device includes a detector which responds to arrival of the device within the non-magnetic section of the drill pipe to automatically energize the instrument for making the photograph or other record. The present invention provides a test circuit for this type of device enabling it to be quickly and easily checked at the surface of the earth before being lowered into the drill string to make certain both that the detector which responds to arrival of the device in the non-magnetic section of pipe is in working condition and that the batteries which energize the device are at a sufficiently high voltage level to assure effective operation of the device in the well.

13 Claims, 5 Drawing Figures

TEST CIRCUIT FOR DETECTOR USED IN WELL BORE

BACKGROUND OF THE INVENTION

This invention relates to improved well instruments, and particularly to survey devices which are to be lowered into a drill string or other string of well pipe for the purpose of recording directional information.

A well known type of survey instrument utilized in drilling operations is the 'single shot' survey tool which normally includes a magnetic compass and a camera for photographing the compass at a location deep within a well. The compass assembly may include an inclinometer, so that the photographic record can indicate both the inclination of the portion of the drill string within which the picture is taken and the direction of that inclination. This information may then be utilized for determining the direction in which further drilling should be aimed.

In order to enable response of the compass to the earth's magnetic field, the drill string may be formed to include a short section of non-magnetic pipe at the survey location within which the instrument is received while the picture is taken. For use with a drill string having such a non-magnetic section, U.S. Pat. No. 4,365,197 issued Dec. 21, 1982 to Pyatt et al. on "Identification Of Pipe Material In Wells" has disclosed a sensor unit adapted to be lowered into the drill string with the instrument, and which includes a detector constructed to respond to arrival of the instrument within the non-magnetic section of pipe and upon such arrival automatically initiate a cycle of operation of the camera. This eliminates the necessity for attempting to estimate the time that the lowering operation will take, and then presetting the instrument to take a picture at that time, a procedure which almost invariably results in a substantial waste of rig time.

One problem which has been encountered in the use of automatic sensors of the above discussed type is that of reliably ascertaining before lowering of the device into a well that the device is in good working condition and will in fact function to make the desired survey record. If the circuitry of the automatic control system is inoperative for any reason, the entire period of time required for lowering the instrument and then retreiving it may be lost, with no survey information being obtained. Further, even if the unit is checked at the surface of the earth and the camera lamps operate properly at that location, this does not assure that the battery voltage level after the test procedure will remain high enough to assure proper illumination of the lamps again in the well.

SUMMARY OF THE INVENTION

The present invention provides a unique test circuit arrangement for a well instrument of the above discussed type which enables the instrument to be checked very easily and rapidly at the surface of the earth by an extremely simple testing operation to determine immediately whether or not the circuitry is in completely operative condition. The test circuit preferably responds to an output signal from the detector which senses the presence of non-magnetic electrically conductive material at the outside of the body of the device, and in the optimum arrangement also responds to a second signal determined by the battery voltage level, and may produce a single common indication dependent upon both of those signals and indicating to a user that the device is in operative condition and that both the detector and batteries are functioning properly.

BRIEF DESCRIPTION OF THE DRAWINGS

The above and other features and objects of the invention will be better understood from the following detailed description of the typical embodiment illustrated in the accompanying drawings in which.

DESCRIPTION OF THE PREFERRED EMBODIMENT

Figure 1:
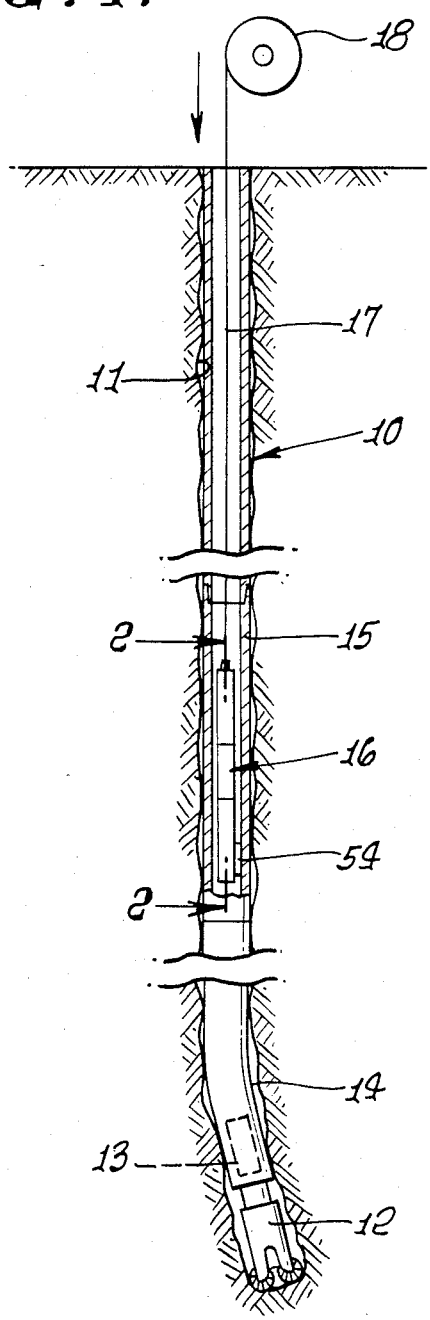
FIG. 1 is a diagrammatic representation of a drill string having a survey instrument embodying the invention lowered therein to a predetermined survey location.

In FIG. 1, there is represented at 10 a conventional drill string extending downwardly within a well 11 and having a bit 12 at its lower end driven by a motor 13 to drill the well. The motor and bit may be carried by a conventional bent sub 14 which directs the bit at an angle for directional drilling purposes. The drill string along most of its length is formed of conventional steel pipe, which of course is magnetic, with a section or collar 15 of non-magnetic pipe being connected into the string at a predetermined sub-surface location to enable magnetic surveying of the well at that depth. This essentially non-magnetic or relatively non-magnetic section of pipe 15 is conventionally formed of monel metal.

Figure 2A:
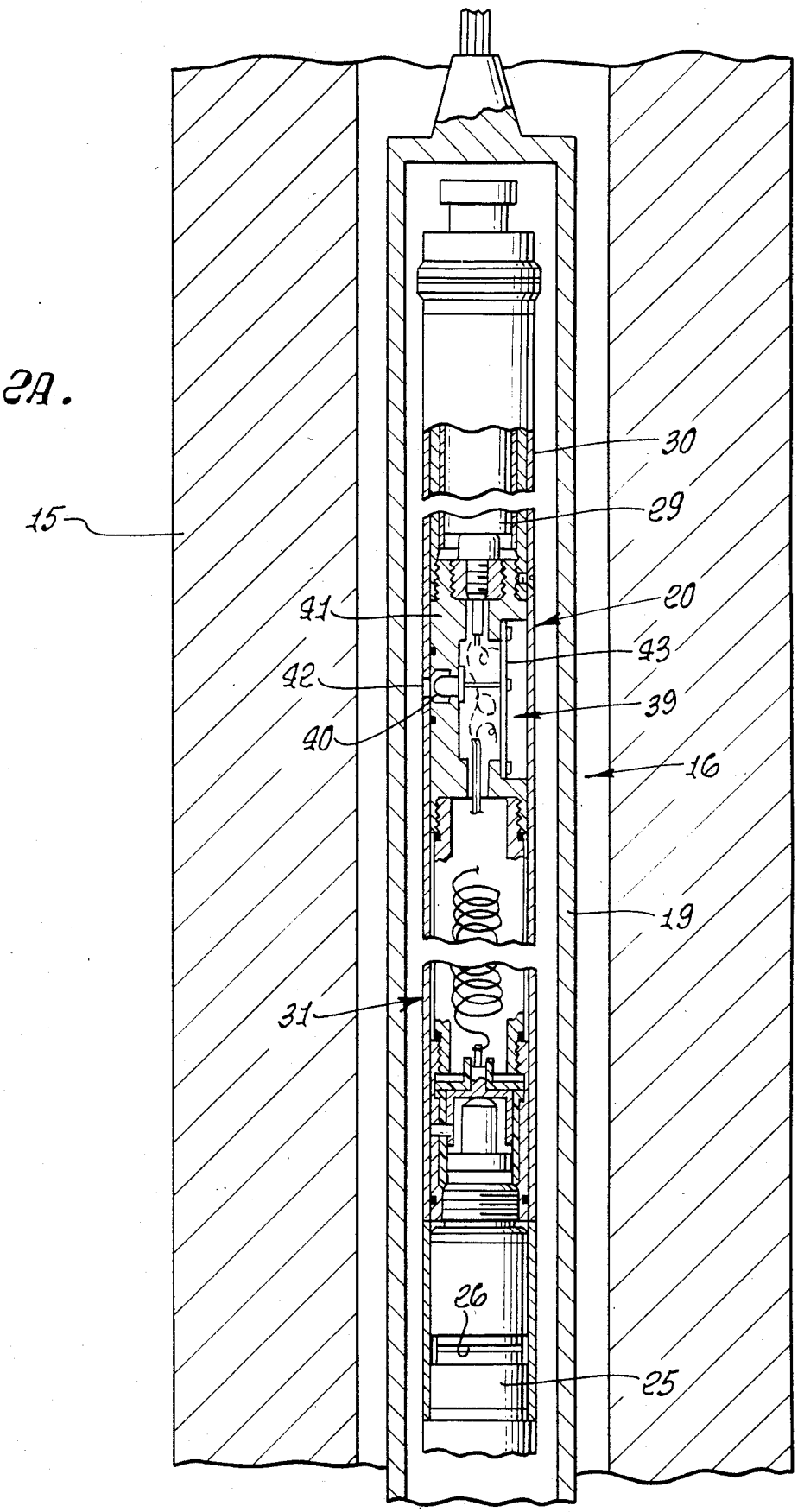
FIGS. 2A and 2B comprise together a vertical or axial section taken on line 2—2 of FIG. 1.
Figure 2B:
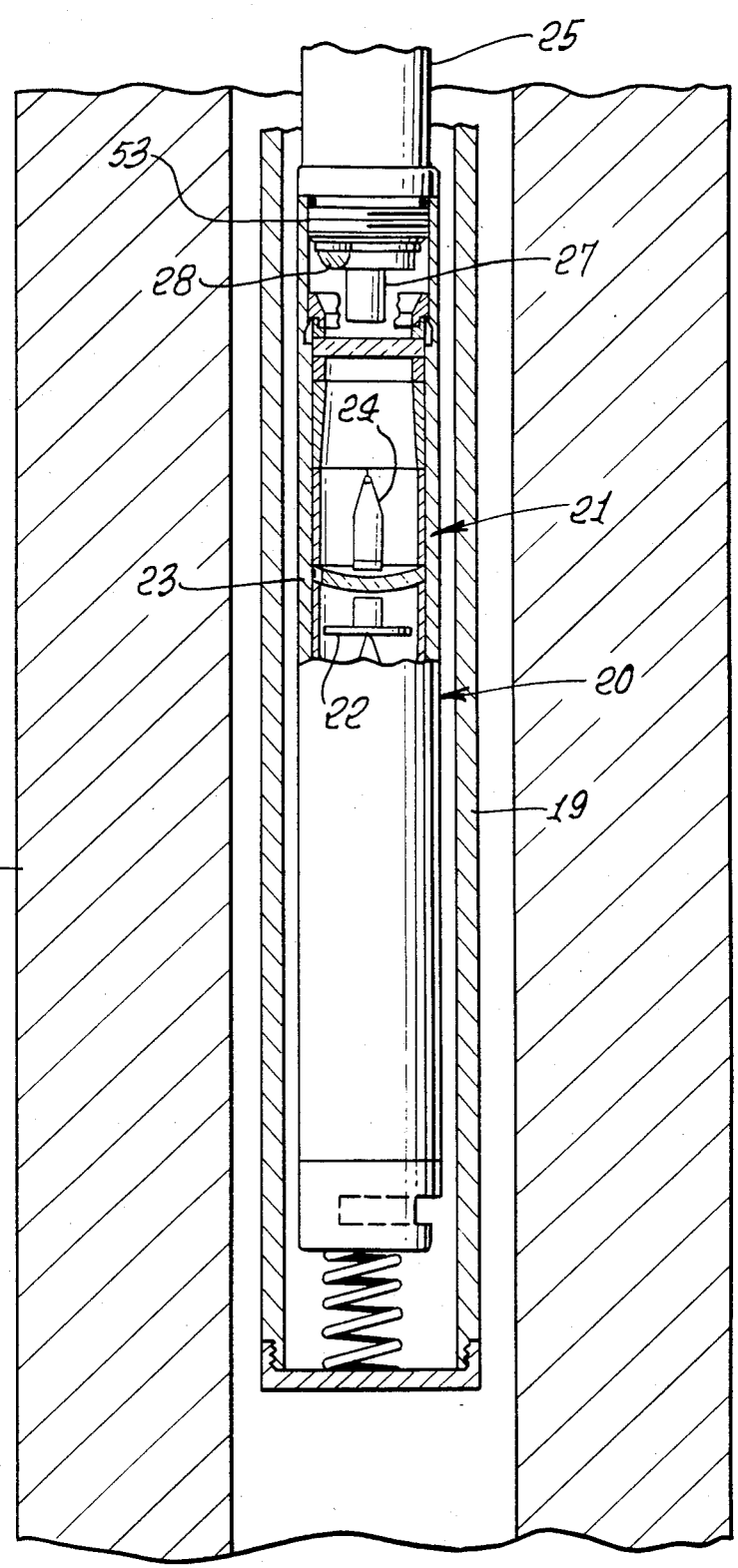

To obtain survey information at the level of section 15 of the drill string, there is lowered into the well a survey tool 16, suspended on a wire line 17 which is lowered by a drum or other equipment represented diagrammatically at 18. Certain of the details of this tool 16 are illustrated in FIGS. 2A and 2B. As seen in those figures, the tool includes an outer rigid hollow pressure barrel 19 which is capable of withstanding without collapse the pressures encountered in the well, and which contains and protects against contact with the well fluids an inner unit 20 comprising the survey device proper.

Unit 20 may include any conventional type of single shot magnetic compass assembly 21 including a tiltable rotary compass element 22 adapted to return automatically to a position of alignment with the earth's magnetic field in a manner indicating compass direction with respect to the tubular housing 23 of the device. A plumb bob or other inclination responsive element represented at 24 swings or otherwise moves to a position indicating inclination with respect to the compass card, so that together these elements of the compass assembly 21 indicate both the inclination of the drill string and the direction of that inclination. As will be understood, in order to enable response of the compass to the magnetic field of the earth as discussed, the housing of unit 20 and the outer pressure barrel 19 must both be formed of non-magnetic material preferably monel metal.

Above compass assembly 21, unit 20 includes a camera 25, also of known construction, having a slot 26 through which film may be inserted into the camera, and having a lens assembly 27 aimed downwardly to photograph on the film received within slot 26 the position of the compass element 22 and inclination indicating element 24. A number of electric lamps 28 may be positioned about the lens assembly 27, to illuminate the compass and inclination elements 22 and 24, with the period of exposure of the film being determined by the length of time that the lamps 28 are energized.

All of the equipment within unit 20 is energized electrically by a number of batteries 29 contained within the upper portion 30 of the outer shell of unit 20. No attempt has been made to illustrate fully in FIGS. 2A and 2B the wires for connecting the batteries to the various sections of the device.

Figure 4:
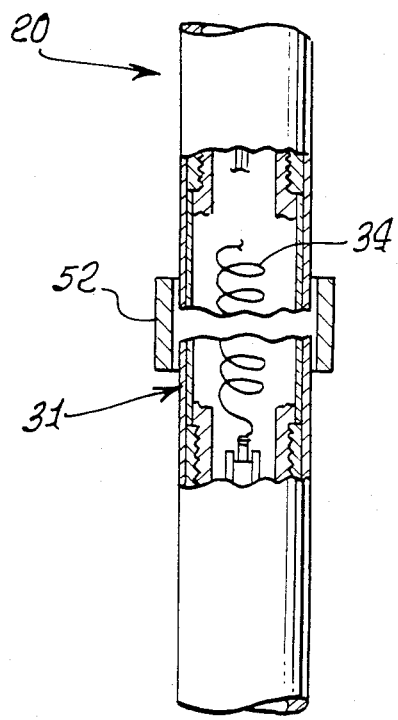
FIG. 4 is a fragmentary view representing a portion of FIG. 2A and showing the manner in which a test ring can be placed about the device at the surface of the earth to energize the test light and to determine whether the instrument is in operative condition.

Just above the camera 25 in unit 20, there is provided a section 130 of that unit containing the automatic monel sensing circuitry disclosed in the above identified U.S. Pat. No. 4,365,197. The present disclosure will not be lengthened by illustration and description in detail of the circuitry of that sensor arrangement, but instead the disclosure of U.S. Pat. No. 4,365,197 is incorporated herein by reference. More particularly, the circuitry shown in FIG. 4 of U.S. Pat. No. 4,365,197 is contained within section 31 of unit 20 of the present device, and is illustrated diagrammatically in the circuit diagram of FIG. 3 by representation at 32 of the non-magnetic metal detector circuit illustrated in the upper portion of FIG. 4 of U.S. Pat. No. 4,365,197, and representation at 33 of the timer arrangement illustrated in the lower portion of FIG. 4 of that prior patent. The metal detector 32 includes a coil 34 associated with a magnetic core element 35 and energized by an oscillator represented at 36. The coil 34 of the present invention corresponds to coil 20 of U.S. Pat. No. 4,365,197, and is energized in accordance with the teachings of that patent at a frequency between about 400 and 800 cycles per second, preferably 500 cycles per second. When coil 34 is located within a magnetic metal portion of the drill string, the magnetic field produced by that coil flows through the surrounding drill string. When coil 34 reaches a position at which it is located within the non-magnetic portion of the drill string, the magnetic field produced by the coil progressively expands and collapses without any tendency for concentration of the lines of force in the non-magnetic material of that portion 15 of the drill string, and the overall effect produced by the lines of force repeatedly cutting through the conductive metal of section 15 induces electrical current flow within the wall of that section. The resultant change in current flow and voltage across the coil 34 is sensed by the remainder of the circuitry of detector 32, as discussed in detail in U.S. Pat. No. 4,365,197, to produce an electrical output signal in line 37 leading from detector 32. In the preferred arrangement, the signal in line 37 is high when unit 20 is located within the electrically conductive but non-magnetic section 15 of the drill string, but is low when the unit 20 is located within the magnetic metal portion of the drill string. The high signal energizes electronic timer 33, which acts to first time a countdown or delay interval of typically about 80 seconds, and then after that delay interval produce an output signal in a line 38 energizing lamps 28 of camera 25 to photograph the compass assembly. The timer 33 maintains energization of the lamps for a predetermined interval, typically 15 seconds, just sufficient to give enough illumination for production of a proper photographic record of the compass and plumb bob positions on the film. The timer then automatically turns off the lamps and prevents their re-energization until the instrument has been pulled to the surface of the earth and reset for another operation. The delay interval before illumination of the lamps allows sufficient time for the instrument, after its initial entry into the nonmagnetic sub 15, to reach a predetermined fully seated position in the drill string, and the delay also allows sufficient time for the compass and plumb bob to settle down to a completely stationary condition for assuring accuracy of the compass and inclination reading. The instrument preferably engages the drill string in a mule shoe connection 54 (FIG. 1) which determines the orientation of the tool with respect to the bent sub.

The present invention is particularly concerned with provision in conjunction with the previously described elements of unit 20 of a test circuit 39 which may be contained within the portion of unit 20 located above detector or sensor 31 in FIGS. 2A and 2B and located beneath the batteries. This circuit is illustrated diagrammatically at 39 in FIG. 3. The circuit includes a light emitting diode 40 which is contained within and carried by a body element 41 of section 39, and which is visible from the outside of unit 20 through a sealed window 42. The electronic elements of the circuit may be carried primarily by a printed circuit board 43 within section 39 of unit 20.

Figure 3:
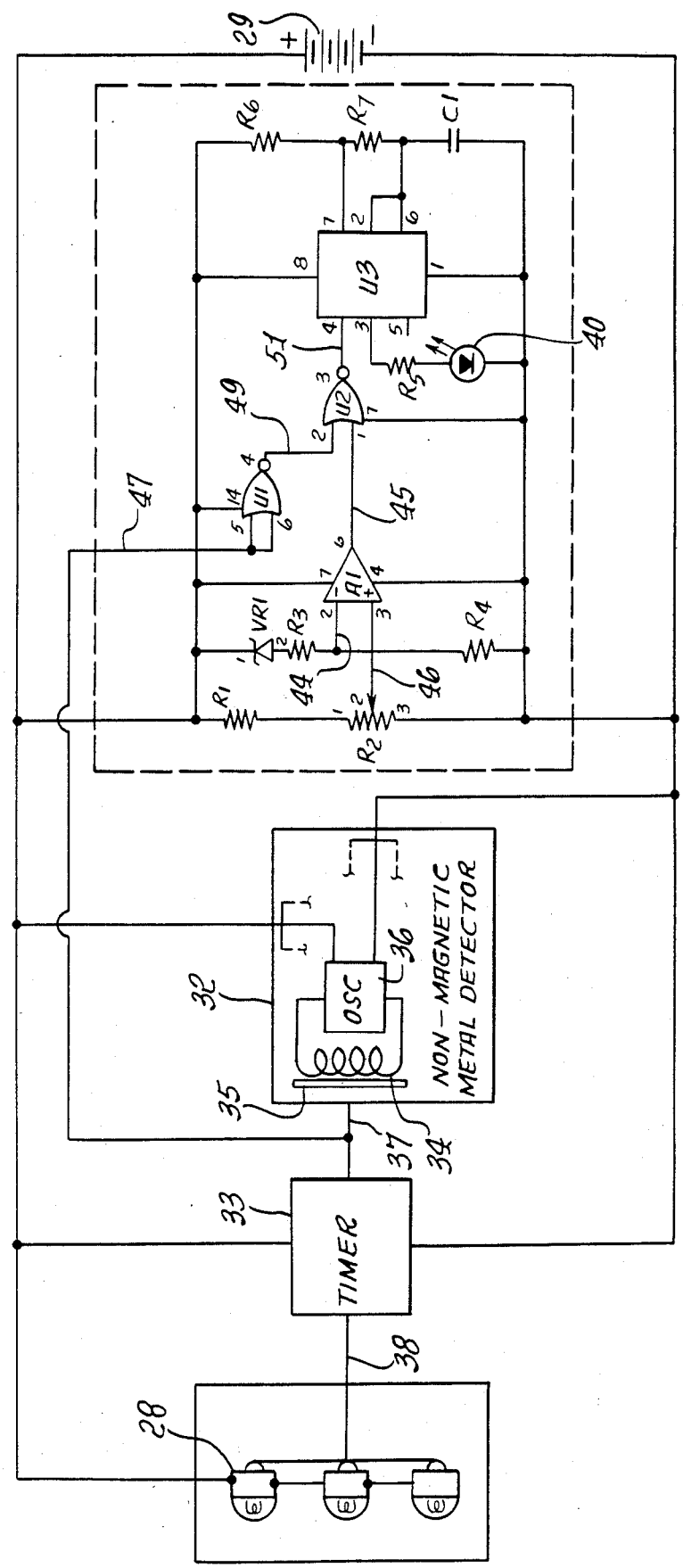
FIG. 3 is a circuit diagram of the test circuit of the invention and related parts.

As seen in FIG. 3, test circuit 39 is energized by batteries 29, which preferably comprise four 1.5 volt batteries providing a normal 6 volt power supply. One of the functions of circuit 39 is to determine whether this normally 6 volt power supply has fallen to a voltage low enough that it may not be capable of properly operating lamps 28 and the other portions of the apparatus through a complete survey cycle. For this purpose circuit 39 is preferably designed to give an indication when the voltage has fallen to about 5 volts, at which time the batteries should be replaced to prevent inadequate exposure of the film in a surveying operation. To sense the voltage for this purpose, circuit 39 includes a resistor R1 and a potentiometer R2 connected in series across the batteries, with the movable contact of the potentiometer being connected to one of the inputs of an operational amplifier A1. The other input of amplifier A1 receives a constant reference voltage through a line 44, connected to a circuit including a solid state voltage regulator VR1 and two resistors R3 and R4. Potentiometer R2 is preset to a condition in which, with a full 6 volt power supply from batteries 29, the voltage delivered to amplifier A1 from the potentiometer is higher by a predetemined amount than the reference voltage delivered to the other input of amplifier A1 through line 44, in which condition the amplifier produces a low signal in its output line 45. If the battery voltage falls to a level at which the potential flowing to the amplifier from potentiometer R2 through line 46 is equal to or lower than the reference voltage in line 44, amplifier A1 responds by producing a high signal in line 45, indicating that the batteries do not have sufficient voltage to assure proper response of the survey instrument and its lamps if lowered into the well. As typical examples, the reference voltage in line 44 may be 1 volt, and the preset voltage in line 46 may be slightly above 1 volt. The potentiometer is set to a position at which its output in line 46 will equal the voltage in line 44 and turn on amplifier A1 when the voltage of the batteries falls to 5 volts, the value at which the batteries should be replaced. At any battery voltage above 5 volts, ample power remains in the batteries to assure full energization and illumination of lamps 28 and the other elements of the circuit through an entire cycle of operation of the survey tool.

A second signal to which the test circuit responds is the high signal in line 37 produced when detector 32 senses that unit 20 is located within the non-magnetic but electrically conductive section 15 of the drill string. When this high signal is delivered through line 47 to a NOR gate U1 of circuit 39, that gate produces an inverted output to deliver to line 49 a low signal indicative of the fact that the survey instrument is located within non-magnetic material. The two low signals in lines 45 and 49 are delivered to two inputs of a second NOR circuit U2, which produces an inverted high signal in its output line 51 only if both of the inputs are low. Thus, a high signal in line 51 indicates both that the batteries are at a voltage above the preselected danger level and that there is a nonmagnetic electrically conductive element such as pipe section 15 at the outside of the survey instrument. When this high signal appears in line 51, it functions to turn on a C MOS low power general purpose oscillator U3, which is connected into the circuitry as illustrated in FIG. 3 and which produces an output flowing through LED 40 and a resistor R5. Oscillator U3 is connected to an RC network including R6, R7 and C1 connected as shown, functioning to cause the power to LED 40 to be alternately turned on and off at a rate determined by the resistance and capacitance used in the RC network, to thereby cause the LED to flash on and off repeatedly as an indication that the entire circuitry is in proper operating condition. In order to attain such an indication when the instrument is at the surface of the earth, there is provided in conjunction with the externally cylindrical elongated unit 20 a ring 52 (FIG. 4), which can be slid axially onto the outside of unit 20 and to a location about coil 34, and which is formed of monel or another electrically conductive but non-magnetic metal having sufficient mass to cause a change in the electrical condition of the circuitry of unit 32 and the current and voltage conditions in coil 34 corresponding to the change of condition of circuit 32 when the unit 20 is located within non-magnetic section 15 of the drill string. In this way, coil 34 and circuit 32 can be caused to produce the same high signal in line 37 of FIG. 3 when the instrument is at the surface of the earth as when it is within the non-magnetic portion of the drill string.

In order to test the survey unit 20 before it has been positioned within pressure barrel 19 and before it has been lowered into the well, an operator may merely slip ring 52 axially onto the outer surface of unit 20 and to a position about coil 34, and when the ring reaches that position L.E.D. 40 should commence flashing if the circuitry of detector 32 is in proper operating condition and if the voltage level of batteries 29 is high enough to assure adequate energization of lamps 28 through a full photographic cycle. This indication is given because the voltage in input 46 through amplifier A1 is above the reference voltage in line 44, causing a low signal in line 45, and because the presence of the non-magnetic ring about the coil causes detector 32 to produce a high signal in line 37 and line 47 leading to circuit 39, with resultant production of a low signal in line 49, and with energization of the L.E.D. by oscillator U3 as a result of the delivery of the two low signals simultaneously to the input of gate U2. If either of the low signals in lines 45 and 49 is not present, the L.E.D. will not be illuminated, indicating to the operator that the survey instrument is not in condition to be used. For example, if the battery voltage level is too low, the low signal will not be present in line 45, and if the circuitry of detector 32 is not operating properly the high signal will not be present in line 47 and the low signal will not be present in line 49, with the result in either event being that the light emitting diode does not come on. To further check the equipment, after the ring has been placed in the position of FIG. 4 about the coil, the operator may note whether the lamps 28 of the camera go on after the proper delay interval of say 80 seconds, and whether the lamps go off after the proper exposure interval of say 15 seconds. To enable the operator to view the condition of the lamps, the compass section 21 and camera section 25 may be threadedly detachable at 53 to expose the lamps to view at the end of the camera. In this connection, it may be noted that the voltage which must remain in batteries 29 in order to cause LED 40 to flash is high enough to energize lamps 28 through a complete test cycle at the surface of the earth as discussed and still leave ample energy in the batteries for an additional full operating cycle of the instrument in the well, preferably with a substantial safety factor.

In a presently preferred specific circuit embodying the invention, the various electrical components of circuit 39 may have values and be of the types set forth below:

| | |
|---|---|
| R1 | 7.87K |
| R2 | 20K |
| R3 | 10K |
| R4 | 40.2K |
| R5 | 100. ohms |
| R6 | 1K |
| R7 | 301K |
| C1 | 1 microfarad |
| U1 and U2 | Gate 4001 |
| U3 | 1 CM 7555 |
| LED 40 | Dialight 521-9190 |
| VR1 | Analog Devices AD 589 JH |
| A1 | RCA CA3130AT |

It is also assumed in the preferred circuitry that the various elements of detector 32 and timer 33 may be of the types and have the values set forth in U.S. Pat. No. 4,365,197 for the components of the corresponding circuit illustrated in FIG. 4 of that patent. In that figure, line 146 delivers the output of the detector portion of the circuit to the timer portion of the circuit and corresponds to line 37 of FIG. 3 of the present application.

While a certain specific embodiment of the present invention has been disclosed as typical, the invention is of course not limited to this particular form, but rather is applicable broadly to all such variations as fall within the scope of the appended claims.

We claim:
1. A device comprising:
   a body to be lowered into a well pipe, the pipe formed primarily of magnetic material and having a section at a predetermined sub-surface location of electrically conductive essentially non-magnetic material;
   an instrument carried by said body for reception in said essentially non-magnetic pipe section and when energized to produce a record dependent on the magnetic field at said location;

a detector carried by said body for automatically controlling said instrument and operable upon arrival at said location to sense the presence of said non-magnetic section of pipe and in response thereto produce a signal causing energization of said instrument to produce said record;

said detector being operable also to produce said signal when said body is at the surface of the earth if a test element of electrically conductive non-magnetic material is brought near the body; and a test circuit responsive to development of said signal at the surface of the earth to produce an indication that the detector is in working condition without operation of said instrument.

2. A device as recited in claim 1, in which said test circuit includes an indicator light carried by said body and which is automatically energized in response to development of said signal at the surface of the earth to indicate to an operator that the detector is in working condition.

3. A device as recited in claim 1, in which said test circuit includes an indicator light carried by said body and which is automatically energized in response to development of said signal at the surface of the earth to indicate to an operator that the detector is in working condition, and means for turning said light alternately off and on through a series of cycles when energized.

4. A device as recited in claim 1, including battery means for energizing said instrument, said test circuit being operable when the device is at the surface of the earth to produce a predetermined indication if the voltage of said battery means is high enough to properly actuate said instrument in a well.

5. A device as recited in claim 1, in which said instrument includes a compass assembly for indicating the inclination of said well pipe and the direction of that inclination, and a camera for photographing said compass assembly, there being a timer operable by said signal to energize said camera to photograph the compass assembly after expiration of a predetermined time delay interval following production of the signal.

6. A device comprising:

a body to be lowered into a well pipe, the pipe formed primarily of magnetic material and having a section at a predetermined sub-surface location of electrically conductive essentially non-magnetic material;

an instrument carried by said body for reception in said essentially non-magnetic section of pipe and when energized to produce a record dependent on the magnetic field at said location;

battery means carried by said body for energizing said instrument;

a detector carried by said body for automatically controlling said instrument and operable upon arrival at said location to sense the presence of said non-magnetic section of pipe and in response thereto produce a signal causing energization of said instrument to produce said record;

said detector being operable also to produce said signal when said body is at the surface of the earth if a test element of electrically conductive non-magnetic material is brought near the body; and a test circuit responsive to both said signal from the detector and the voltage level of said battery means, and including a common indicator actuable to a predetermined condition only if said signal is produced by the detector and the voltage of said battery means is at least up to a predetermined value.

7. A device as recited in claim 6, in which said common indicator is an indicator light carried by said body and visible from the exterior thereof to an operator at the surface of the earth.

8. A device as recited in claim 6, in which said common indicator is a light carried by said body and visible to an operator from the exterior thereof when the device is at the surface of the earth, said test circuit including means for turning said light alternately off and on through a series of cycles.

9. A device as recited in claim 6, in which said test circuit includes means energized by said battery means for establishing a reference voltage lower than the voltage of the battery means, and means for comparing to said reference voltage a voltage which varies in accordance with changes in the voltage of said battery means and acting to prevent actuation of said common indicator when said voltage varying with that of the battery means falls below said reference voltage.

10. A device as recited in claim 6, in which said test circuit includes means for producing a second signal when said voltage of the battery means is above said predetermined value, and gate means to which said first mentioned signal and said second signal are delivered as inputs and acting to actuate said common indicator only if both signals are present.

11. A device as recited in claim 6, including said test element as an element of the claim, formed as a ring of said electrically conductive non-magnetic material movable axially relative to said body to a position thereabout for actuating the test circuit.

12. A device comprising:

a body to be lowered into a string of drill pipe, the pipe formed primarily of magnetic material and having a section at a predetermined sub-surface location of electrically conductive essentially non-magnetic material;

a compass assembly carried by said body for reception in said essentially non-magnetic section of pipe and when energized to produce a photographic record of the inclination of said well pipe and the direction of that inclination;

a camera including lamp means energizable to illuminate the compass assembly and produce a photographic record of its condition on a film in the instrument;

a detector carried by said body for automatically controlling energization of said lamp means and operable upon arrival at said location to sense the presence of said non-magnetic section of pipe and in response thereto produce a first signal;

a timer responsive to said first signal to energize said lamp means after expiration of a predetermined delay interval and then de-energize said lamp means at the end of a predetermined illumination period;

said detector being operable also to produce said first signal when said body is at the surface of the earth if a test ring of electrically conductive non-magnetic material is moved to a predetermined position about the detector;

battery means carried by said body for energizing said lamp means and said detector; and a test circuit including means operable to produce a second signal if the voltage of said battery means falls to a predetermined level, an indicator common to both the detector and said battery means, and means responsive to both said first signal and said second signal for actuating said common indicator to indicate to an operator that the device is in working condition only if both said first signal and said second signal are received.

13. A device as recited in claim 12, in which said common indicator is an indicator light carried by said body and visible from the exterior thereof and which is turned on by receipt of both of said signals simultaneously.

* * * * *